United States Patent [19]

Schultz

[11] Patent Number: 4,503,397

[45] Date of Patent: Mar. 5, 1985

[54] AM STEREO PILOT SIGNAL DETECTION CIRCUITRY

[75] Inventor: Frederick K. Schultz, Bringhurst, Ind.

[73] Assignee: General Motors Corporation, Detroit, Mich.

[21] Appl. No.: 389,212

[22] Filed: Jun. 17, 1982

[51] Int. Cl.[3] .......................... H03K 9/02; H03D 1/04

[52] U.S. Cl. ....................................... 328/138; 381/12; 381/13; 307/522

[58] Field of Search ......................... 307/522, 523, 354; 328/138; 381/12, 13

[56] References Cited

U.S. PATENT DOCUMENTS

| | | | |
|---|---|---|---|
| 2,712,065 | 6/1955 | Elbourn et al. | 307/445 |
| 3,585,400 | 6/1971 | Brayton | 307/523 |
| 3,778,638 | 12/1973 | Garratt | 307/523 |
| 3,943,382 | 3/1976 | Hermansdorfer et al. | 307/522 |
| 4,344,038 | 8/1982 | Streeter | 307/523 |
| 4,405,837 | 9/1983 | Ecklund | 307/522 |
| 4,410,762 | 10/1983 | Ecklund | 307/522 |

*Primary Examiner*—John S. Heyman
*Attorney, Agent, or Firm*—Albert F. Duke

[57] ABSTRACT

A stereo pilot signal detector for an AM stereo receiver connects an input signal to a train of pulses corresponding to zero crossings of the input signal. These pulse lock a shift register having a data input connected with a timer which is reset from the pulses after the shift register is clocked. The timer produces a logic "1" input to the register during a time interval extending on either side of the zero crossings of the stereo pilot signal. If four consecutive zero crossings occur within the window, the stereo decoder and an indicator are enabled. Thereafter, if three out of four zero crossings occur outside said interval, the stereo decoder and indicator are disabled.

3 Claims, 2 Drawing Figures

AM STEREO PILOT SIGNAL DETECTION CIRCUITRY

FIELD OF THE INVENTION

This invention relates to frequency detection and, more particularly, to a circuit for accurately detecting a relatively low frequency pilot signal transmitted with an AM stereo signal.

BACKGROUND OF THE INVENTION

AM stereo systems have been proposed that transmit an infrasonic pilot signal such as 5 Hz. which when detected closes an electronic stereo switch which permits demodulation of the composite stereo signal and also causes a stereo indicator lamp to be energized. Prior art pilot signal detectors use a low Q bandpass filter or a low pass filter with output voltage detection. These approaches suffer from a high occurrence of false triggering. False triggering can occur when the carrier of two AM stations are separated by the frequency of the pilot signal. FCC Rules allow the carriers to be as much as 20 Hz. off the assigned frequency. Thus, there is a high probability of low frequency beat note near 5 Hz. being present. False triggering can also be caused by AM to PM conversion to the receiver or from power line interference. The problem of false triggering can be alleviated to some degree by using a high Q bandpass filter but this approach has the tendency to ring when a transient near the pilot frequency occurs.

SUMMARY OF THE INVENTION

In view of the above, it is an object of the present invention to provide an improved frequency detector. It is another object of the present invention to provide a stereo pilot signal detector which provides a first output when a predetermined number of consecutive zero crossings of the pilot signal occur within a predefined time window and which maintains said output state until a predetermined number of consecutive zero crossings of said pilot signal occur outside said time window.

In accordance with the present invention, the pilot signal, of frequency f, is filtered and fed to a zero crossing detector which produces a train of pulses which occur at 1/2f time intervals. In the case of a 5 Hz. signal, the pulses occur at 100 millisecond time intervals. Each pulse clocks a four stage shift register whose data input is the output of a timer which is reset by the pulses and provides a high logic level output for a 20 millisecond time window which opens 90 milliseconds after each pulse and closes 110 milliseconds after each pulse. Each time a pulse in the train occurs within the window, a "1" is entered into the shift register and each time a pulse in the train occurs outside the window, a zero is entered into the shift register. The content of the shift register is converted to a DC voltage which provides one input to a voltage comparator. The other input to the comparator is a first or second threshold level depending upon the state of the comparator to add hystersis in the comparator output. The threshold levels are established such that four consecutive zero crossings of the pilot signal must occur within the time window for the stereo indicator and stereo switch to be activated. Once activated, deactivation of the stereo indicator and stereo switch requires three out of four zero crossings occur outside the time window.

A more complete understanding of the present invention may be had from the following detailed description which should be read in conjunction with the drawings in which:

DESCRIPTION OF THE PREFERRED EMBODIMENT

Figure 1:
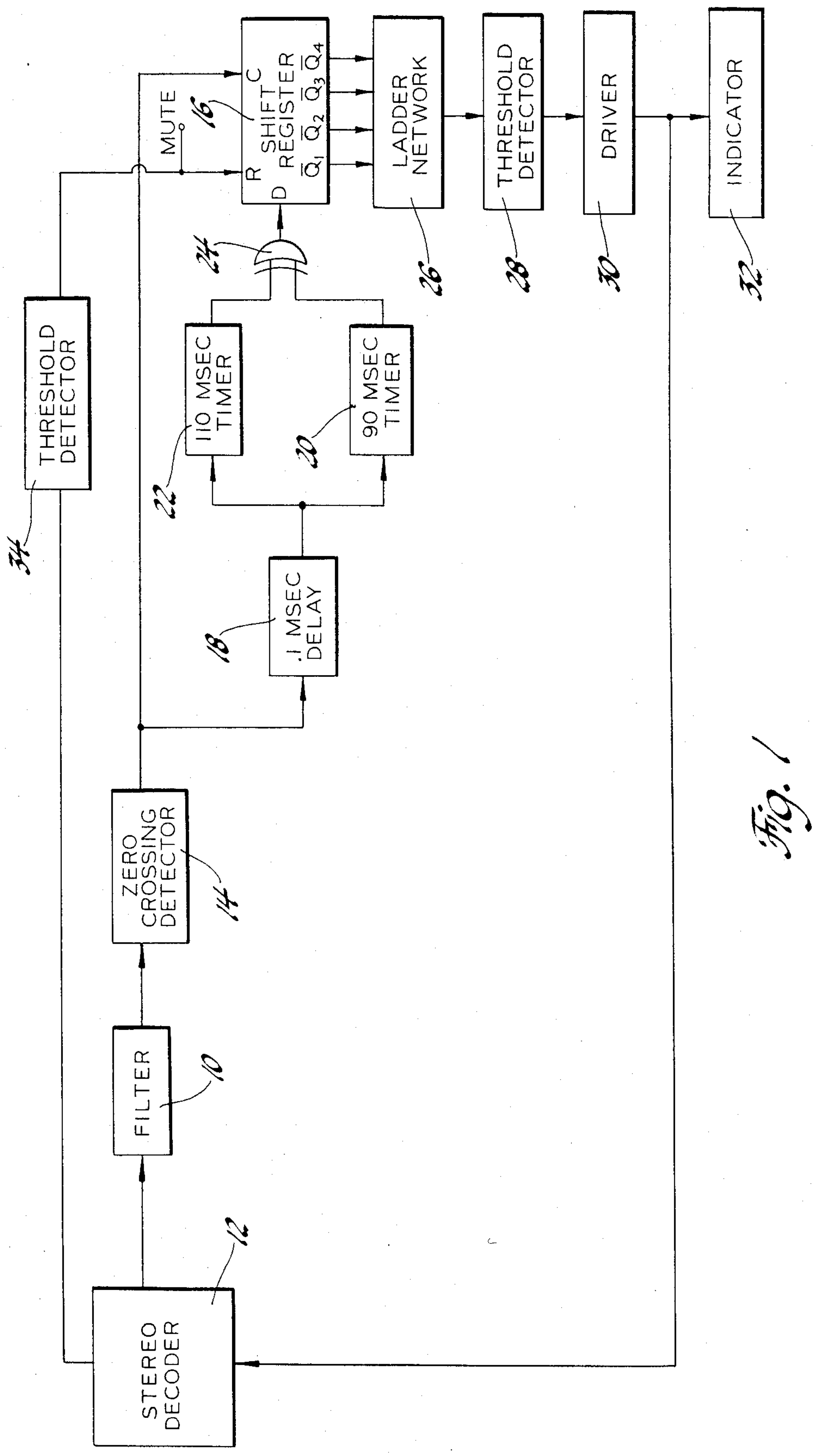
FIG. 1 is a block diagram of the detector of the present invention.

Referring now to the drawings and initially to FIG. 1, the detector of the present invention comprises filter means generally designated 10, including an input terminal connected with an AM stereo decoder chip 12, such as the LM 1981 manufactured by National Semiconductor Inc., which provides the L-R and pilot signal when an AM stereo signal is being received. The filter means 10 removes the L-R information and passes the pilot signal, which in this example is a 5 Hz. sine wave, to a zero crossing detector, generally designated 14, which produces a train of pulses at each zero crossing of the filtered input signal. The pulse train is fed to the clock input of a four stage shift register 16 and also to a 0.1 millisecond delay circuit 18. The delayed pulse train resets a 90 millisecond timer 20 and a 110 millisecond timer 22. The outputs of the timers 20 and 22 are input to an EXCLUSIVE OR gate 24, the output of which is connected with the D input of the shift register 16. The binary data appearing at the $\overline{Q}$ outputs of the register 16 is converted to a DC voltage by a resistor ladder network 26 which provides one input to a threshold detector generally designated 28. The detector 28 has a lower threshold level of, for example, 1.8 volts and an upper threshold level of, for example, 5.8 volts, thereby adding hysteresis to its switching action. For example, the output of the detector 28 will go low when the input exceeds 5.8 volts and will remain low until the input drops below 1.8 volts whereupon the detector output will switch high. The output of the detector 28 controls a driver 30 which drives an indicator 32 and provides an input to the decoder 12 which permits the stereo information to be decoded. The shift register 16 may be reset by a MUTE input or by an output from the decoder 12 whenever the magnitude of the L-R information indicates that the index of modulation exceeds a desirable value, in this instance 1 radian. When the excess phase output of the LM 1981 exceeds a level set by threshold detector 34, the shift register 16 is reset. Other conditions, such as AGC voltage level, may be monitored and used to reset the register when it is desirable to switch from a stereo to a mono condition.

Figure 2:
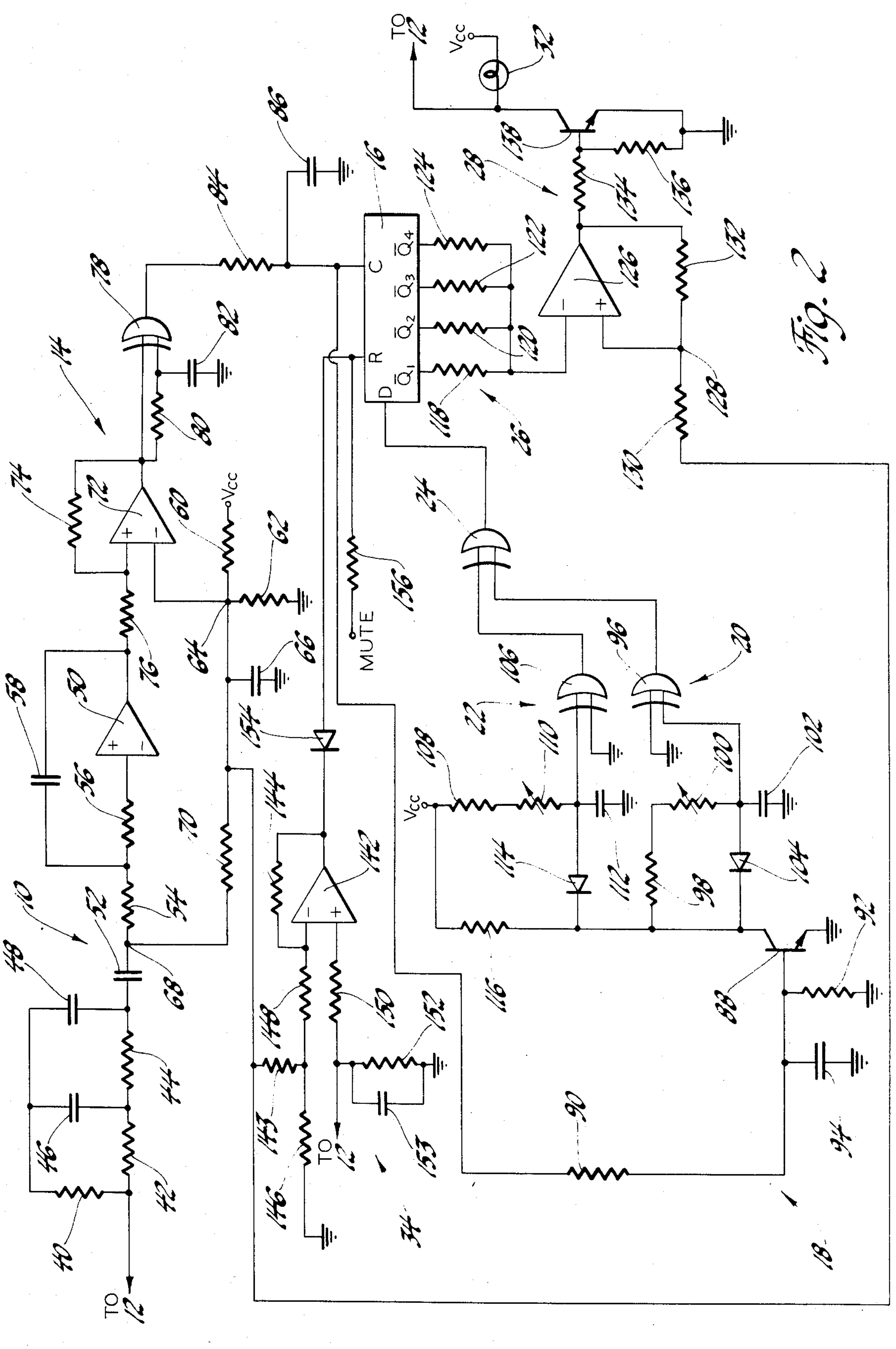
FIG. 2 is a detailed schematic diagram of the detector of the present invention.

As shown in FIG. 2, the filter means 10 comprises a low pass filter, including resistors 40, 42 and 44 and capacitors 46 and 48, which is coupled to a bandpass amplifier 50 through a capacitor 52 and resistors 54 and 56. A feedback capacitor 58 is connected between the output of amplifier 50 and the junction between resistors 54 and 56. An 8-volt supply Vcc is connected through voltage dividing resistors 60 and 62 to produce ½ Vcc at the junction 64. The junction 64 is connected to ground through a capacitor 66 and to the junction 68 through a resistor 70.

The zero crossing detector 14 comprises an amplifier 72 whose noninverting input is connected to its output through a resistor 74 and to the output of the amplifier 50 through a resistor 76. The amplifier 72 converts the sine wave output of the amplifier 50 to a rectangular wave. The output of the amplifier 72 is fed to a transition detector comprising an EXCLUSIVE OR gate 78 and a delay network comprising resistor 80 and capacitor 82. The output of the amplifier 72 is connected directly to one input of the gate 78 and to the other input through the delay network. Thus, each time the output of the amplifier 72 switches, one input to the gate 78 changes immediately while the other input does not change for a short interval of time causing opposite level inputs to the gate 78 on each transition of the amplifier 72 and producing a pulse train at the output of the gate 78. The output of the gate 78 is fed to a filter network comprising a resistor 84 and capacitor 86. The filtered output of the gate 78 is connected to the clock input of the shift register 16 and to the delay network 18 comprising a transistor 88, resistors 90 and 92 and capacitor 94. The 90 millisecond timer 20 comprises an EXCLUSIVE OR gate 96, resistors 98 and 100, capacitor 102 and diode 104. Similarly, the 110 millisecond timer 22 comprises an EXCLUSIVE OR gate 106, resistors 108 and 110, capacitor 112 and diode 114. The diodes 104 and 114 are connected to the collector of transistor 88 and through a resistor 116 to Vcc. The output of gates 96 and 106 provide inputs to the EXCLUSIVE OR gate 24, the output of which is connected to the D-input of the shift register 16.

The resistor ladder network 26 comprises equal value resistors 118, 120, 122 and 124 connected with the $Q_1$, $Q_2$, $Q_3$ and $Q_4$ outputs of the shift register 16, respectively. The threshold detector 28 comprises an operational amplifier 126 having its inverting input connected with each of the resistors 118–124. The noninverting input of the amplifier 126 is connected to the junction 128 between voltage dividing resistors 130 and 132. The other side of resistor 130 is connected with ½ Vcc at the junction 64 while the other side of resistor 132 is connected to the output of the amplifier 126. The output of amplifier 126 is also connected through a voltage dividing network, comprising resistors 134 and 136, to driver transistor 138, the collector of which is connected with the stereo decoder 12 and to the stereo indicator lamp 32. The detector 34 comprises an amplifier 142. A voltage divider network comprises resistors 143 and 144 is connected to the ½ Vcc junction 64 and ground. Resistors 146 and 148 establish upper and lower threshold levels at the inverting input of the amplifier 142 to add hysteresis to its switching action. The excess phase output of the decoder 12 is connected to the noninverting input of the amplifier 142 through a resistor 150. Filter network including resistor 152 and capacitor 153 is connected to the decoder 12 to prevent short duration pulses from affecting the state of the amplifier 142. The output of the amplifier 142 is connected to the reset input of the shift register 16 through diode 154. The MUTE line is connected to the reset input through resistor 156.

The operation of the detector of the present invention is as follows assuming, initially, that an AM stereo signal is being received so that a 5 Hz. sine wave is present at the input of the zero crossing detector 14. The 5 Hz. sine wave will produce a pulse train, at the output of the zero crossing detector, containing pulses separated by 100 milliseconds. The timers 20 and 22 are reset 1/10 millisecond after each pulse in the pulse train and their outputs are both driven low causing the output of the gate 24 to be low. The output of the timer 20 goes high 90 milliseconds after reset, causing the output of the gate 24 to go high. The output of the timer 22 will go high 110 milliseconds after reset, and the output of the gate 24 will go low. If, however, a zero crossing occurs within the 20 millisecond time window from 90 to 110 milliseconds following reset, the output of the gate 24 will be high and a logic "1" will be clocked into the shift register 16. If a zero crossing occurs less than 90 milliseconds or more than 110 milliseconds from the previous zero crossing, the output of the gate 24 will be low and a logic zero will be clocked into the register 16. The threshold detector 28 has an upper threshold level of approximately 5.8 volts and a lower threshold level of approximately 1.8 volts. When the register 16 is reset, such as when the receiver is muted, the outputs $Q_1$–$Q_4$ are all logic "1's," producing a voltage of approximately 8 volts on the inverting input of the amplifier 126. This causes the output to switch low which turns off the transistor 138, deenergizing the pilot lamp 32 and switching the decoder 12 from the stereo to mono mode. Once the output of the amplifier 126 has switched to a low state, the lower threshold level of 1.8 volts appears at the noninverting input. As successive "1's" are clocked into the register 16, the voltage at the inverting input of amplifier 126 drops from 6 to 4 to 2 volts. As the fourth consecutive "1" is entered in the register 16, all outputs go to zero causing zero volts at the inverting input, thus dropping below the lower threshold of 1.8 volts causing the output of the amplifier 126 to switch to a high state, turning on the transistor 138 energizing the lamp 32 and enabling the decoder 12. This action reestablishes the upper threshold level of 5.8 volts at the inverting input to the amplifier 126. As each zeros are entered in the resister 16, the voltage at the noninverting input increases by 2 volts so that the upper threshold level of 5.8 volts will be exceeded whenever the register 16 contains three zeros, i.e., three of the $Q_1$–$Q_4$ outputs are "1".

Thus, the decoder 12 and the pilot indicator 32 are enabled whenever four consecutive zero crossings of the input signal within the 20 millisecond time window which brackets the ideal or expected zero crossing time interval of 100 milliseconds. Once enabled, the decoder 12 and indicator 32 are disabled only upon at least three zero crossings out of four occurring outside the time window.

The embodiments of the invention in which an exclusive property or privilege is claimed are defined as follows:

1. Circuitry for detecting an input signal of a predetermined frequency comprising input means including zero crossing detection means for producing a train of pulses corresponding to each zero crossing of said input signal, timer means synchronized to said pulses for producing a first level output for a time interval extending on either side of the next zero crossing of an input signal of said predetermined frequency, memory means responsive to said train of pulses and to the output of said timer means for registering whether a zero crossing of said input signal occurs within or outside said time interval, means responsive to the data in said memory means for producing an enabling output when a predetermined number of consecutive zero crossings occur within said time interval and a disabling output when a second predetermined number of zero crossings in said input signal occur outside said time interval.

2. Circuitry for detecting an input signal of a predetermined frequency comprising input means including zero crossing detector means for producing a train of pulses corresponding to each zero crossing of said input signal, timer means synchronized to said pulses for producing a first level output for a predetermined time window, multi-stage shift register means responsive to said train of pulses and the output of said timer means for registering whether a pulse in said train occurs within or outside said time window, means for converting the data in said shift register means to a DC voltage, voltage comparator means responsive to said DC voltage for switching from a first output level to a second output level when said DC voltage exceeds a first threshold level and for maintaining said second output level until said DC voltage drops below a second threshold level, said DC voltage exceeding said first threshold level in response to data resulting from a first predetermined number of consecutive pulses in said train occurring within said time window and dropping below said second threshold in response to data resulting from a second predetermined number of pulses of said train occurring outside said time window.

3. The circuitry defined in claim 2, wherein said timer means includes first and second timers, each producing a switching action from one output level to a second output level at different time intervals to establish said time window, time delay means for resetting said first and second timers a predetermined time interval after each occurrence of said pulses, an EXCLUSIVE OR gate responsive to the outputs of each of said timers and providing a data input to said shift register, said data converting means comprising a resistor ladder network including a plurality of resistors connecting the outputs of respective stages of said shift register to one input of said voltage comparator means.

* * * * *